United States Patent [19]

Leerssen et al.

[11] Patent Number: 5,197,655

[45] Date of Patent: Mar. 30, 1993

[54] FINE PITCH SOLDER APPLICATION

[75] Inventors: Arthur L. Leerssen, Austin; Everitt W. Mace, Hutto, both of Tex.; Issa S. Mahmoud, Apalachin; Charles T. Randolph, Vestal, both of N.Y.; John Reece, Endicott, N.Y.; Gaston G. Settle, Georgetown, Tex.; Phong T. Truong, Round Rock, Tex.; Srini V. Vasan, Austin, Tex.

[73] Assignee: International Business Machines Corporation, Armonk, N.Y.

[21] Appl. No.: 894,491

[22] Filed: Jun. 5, 1992

[51] Int. Cl.⁵ .................................. H01L 21/58
[52] U.S. Cl. ............................. 228/254; 427/96; 427/259; 118/59
[58] Field of Search ............ 228/252, 253, 254, 180.2; 427/96, 259; 118/59

[56] References Cited

U.S. PATENT DOCUMENTS

| 4,273,859 | 6/1981 | Mones et al. | 427/96 X |
|---|---|---|---|
| 4,614,837 | 9/1986 | Kane et al. | 427/96 X |
| 4,684,055 | 8/1987 | Baer et al. | 228/180.1 |
| 4,722,470 | 2/1988 | Johary | 228/180.2 |
| 4,822,979 | 3/1989 | deKam | 219/241 |
| 4,832,255 | 5/1989 | Bickford et al. | 228/254 |
| 4,854,337 | 8/1989 | Bunkenburg et al. | 134/184 |
| 4,871,899 | 10/1989 | DuFrenne | 219/233 |
| 4,906,823 | 3/1990 | Kushima et al. | 228/245 |
| 4,961,955 | 10/1990 | Goldberg | 427/96 X |

FOREIGN PATENT DOCUMENTS

| 138371 | 10/1979 | Japan | 228/254 |
|---|---|---|---|
| 2021027A | 11/1979 | United Kingdom . | |
| 2138339A | 10/1984 | United Kingdom . | |

Primary Examiner—Kenneth J. Ramsey
Attorney, Agent, or Firm—Andrea P. Bryant; Jeffrey S. LaBaw

[57] ABSTRACT

Methods and apparatus are provided for applying solder in precise amounts to fine pitch leads such as those suitable for direct chip attachment (DCA) or flip-chip applications by using a heated platen to apply pressure to solder overlaying a plurality of lands on circuitized substrate. In one embodiment paste solder screened through a mask having apertures each corresponding to a plurality of land locations. In another embodiment, a web of solder foil is accurately positioned over a plurality of fine pitch lands. In each embodiment, a heated platen includes at least one active element corresponding in size and shape to the area having a plurality of fine pitch lands. A third embodiment includes individual platens for lands to which solder is to be applied.

8 Claims, 4 Drawing Sheets

FINE PITCH SOLDER APPLICATION

BACKGROUND OF THE INVENTION

1. Field of the Invention

The present invention relates to application of solder to circuitized substrates for receiving surface mountable electronic components. More specifically, it relates to solder application to fine pitch lands comprising footprints for directly receiving chips for attachment.

2. Background Art

As the size of printed circuitry decreases, the need for precise, repeatable techniques for processing such circuitry increases. Patterns of lands, or footprints, to which electronic devices are to be connected are comprised of ever shrinking sites as the pitch (distance between) ever narrowing component leads decreases. The desired result is to apply solder only to lands. Otherwise, bridging occurs. Further, current technology contemplates direct chip attachment (DCA) to circuitized substrates. In the case of flip-chips, DCA and other surface mount systems, footprint patterns are often in configurations other than perimetrical rectangles. Connections are necessary between outputs interior of the perimeter outline of a chip, as well as some surface mountable components.

The prior art includes much directed to the broad problem of applying solder—paste or web borne film —to circuit lands. Prior art application methods include screening paste through a mask with apertures corresponding to individual lands in a footprint.

It is also known, as shown in commonly assigned U.S. Pat. No. 4,832,255, to use a heated and reciprocally movable tool to controllably apply pressure and heat to a web borne film of solder positioned over conductive lands on a substrate. This reference also teaches providing sprocket holes in the web for facilitating advancement of the web for solder application at another site.

SUMMARY OF THE INVENTION

The present invention provides a technique for applying solder to fine pitch lands without bridging, using a heated solder non-wettable platen to make solder adhere to lands in a simple, reliable, high yield method.

In a first aspect of our invention, solder paste is screened through a mask having apertures dimensioned and configured such that each overlays a plurality of lands. The heated platen is configured to have element(s) corresponding in size and shape to mask apertures. The platen contacts the screened solder for reflow whereby solder adheres to circuit lands.

In a second aspect, the present invention provides a heated solder non-wettable platen for contacting a film of solder positioned over a footprint on a circuit substrate. The heated platen is reciprocally movable and its active element(s) likewise correspond in size and shape to an area covering a plurality of lands comprising the solder receiving footprint site.

In a third aspect of our invention the solder non-wettable platen comprises plural individual platens. They may be arranged to correspond to some or all the lands associated with one or more footprints.

The apparatus and method of the present invention provide for accurately applying predetermined amounts of solder to fine pitch leads. The invention is easily adapted for automated assembly. Further it allows for unused solder to be recycled.

It is believed that some advantages of our invention proceed from the effects of surface tension and the attraction between solder and conductive lands.

BRIEF DESCRIPTION OF THE DRAWING

The above and other features and advantages will be described below in conjunction with the accompanying drawing wherein like reference numerals are used throughout to designate like elements and wherein.

DESCRIPTION OF A PREFERRED EMBODIMENT

Figure 1:
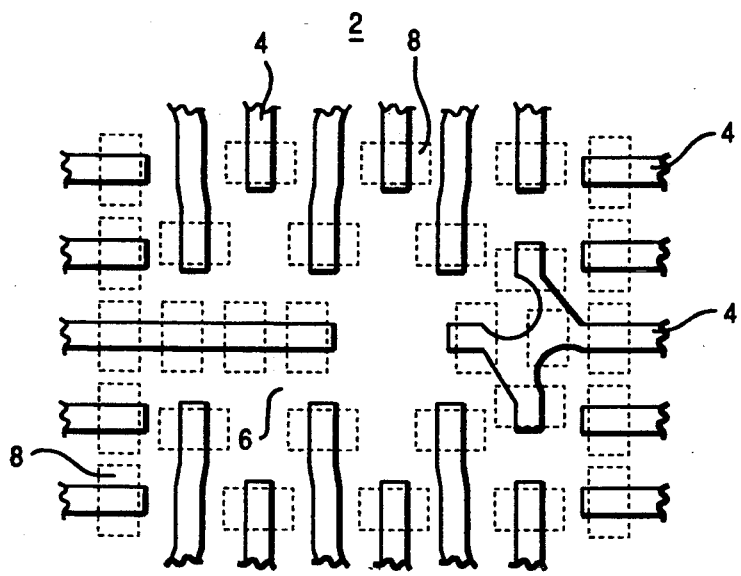
FIG. 1 is a schematic planar illustration of a printed circuit substrate including fine pitch lands.

Refer now to FIG. 1 which shows a portion of a planar schematic of a printed circuit substrate 2. On the surface of substrate 2 are copper lands 4. Lands 4 are typically about 4 mils wide and spaced apart on 12 mils centers. Covering most of the surface area of substrate 2 is a solder resist coating 6. Openings 8 in coating 6 expose those lands 4 to which it is desired to apply solder. Openings are typically about 10×6 mils. Specific chip geometries will obviously require larger/smaller openings.

Figure 2:
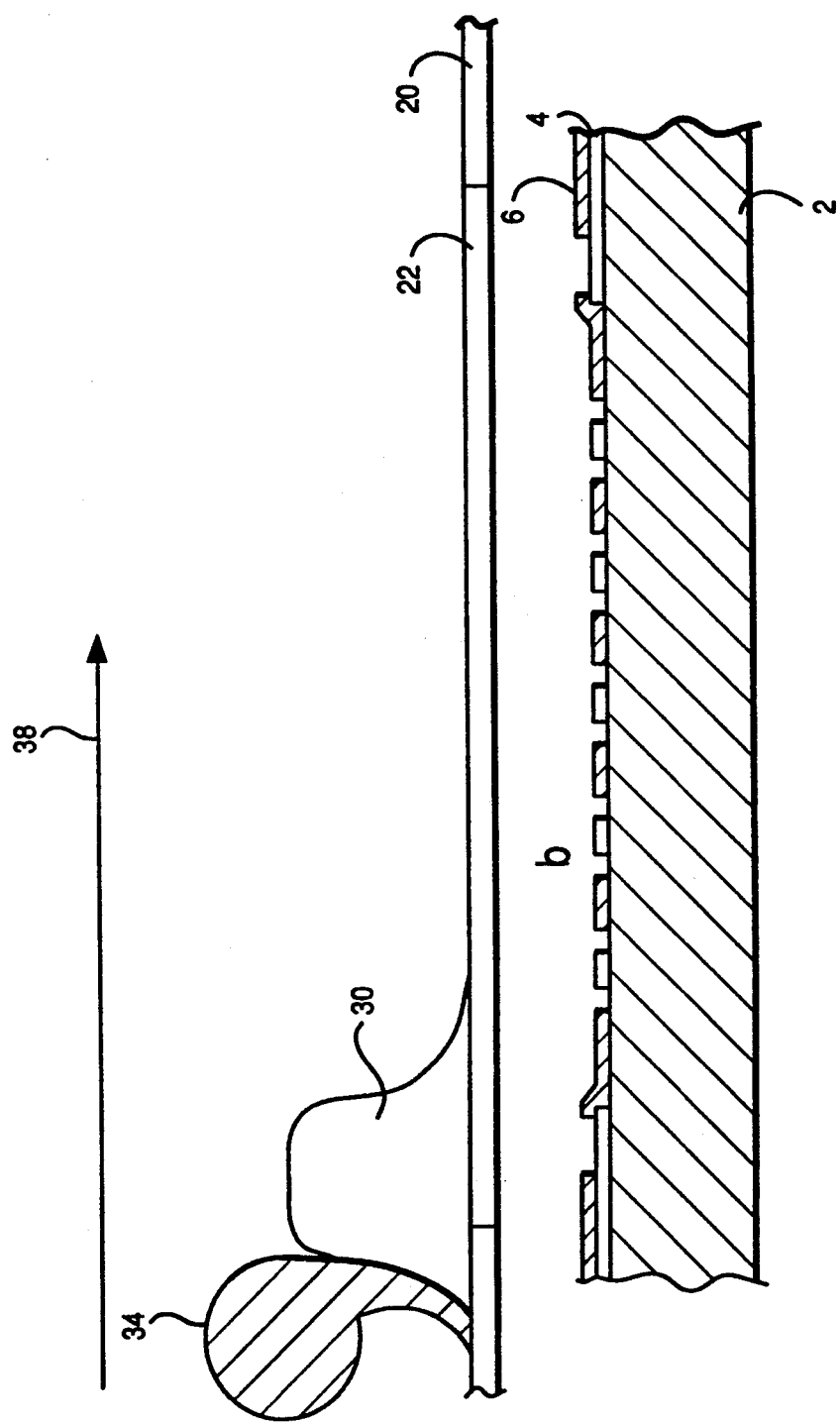
FIG. 2 a illustrates solder paste screening.

In FIG. 2, substrate 2 from FIG. 1 is shown in cross section. Solder resist coating 6 and copper lands 4 are also shown. Stencil 20 has an opening 22 which is large enough and configured so as to expose all of the copper lands 4 desired to receive solder. Solder paste 30 is applied through opening 22 and mask 20 by the action of squeegee 34 when it undergoes motion in the direction of arrow 38.

Figure 3:
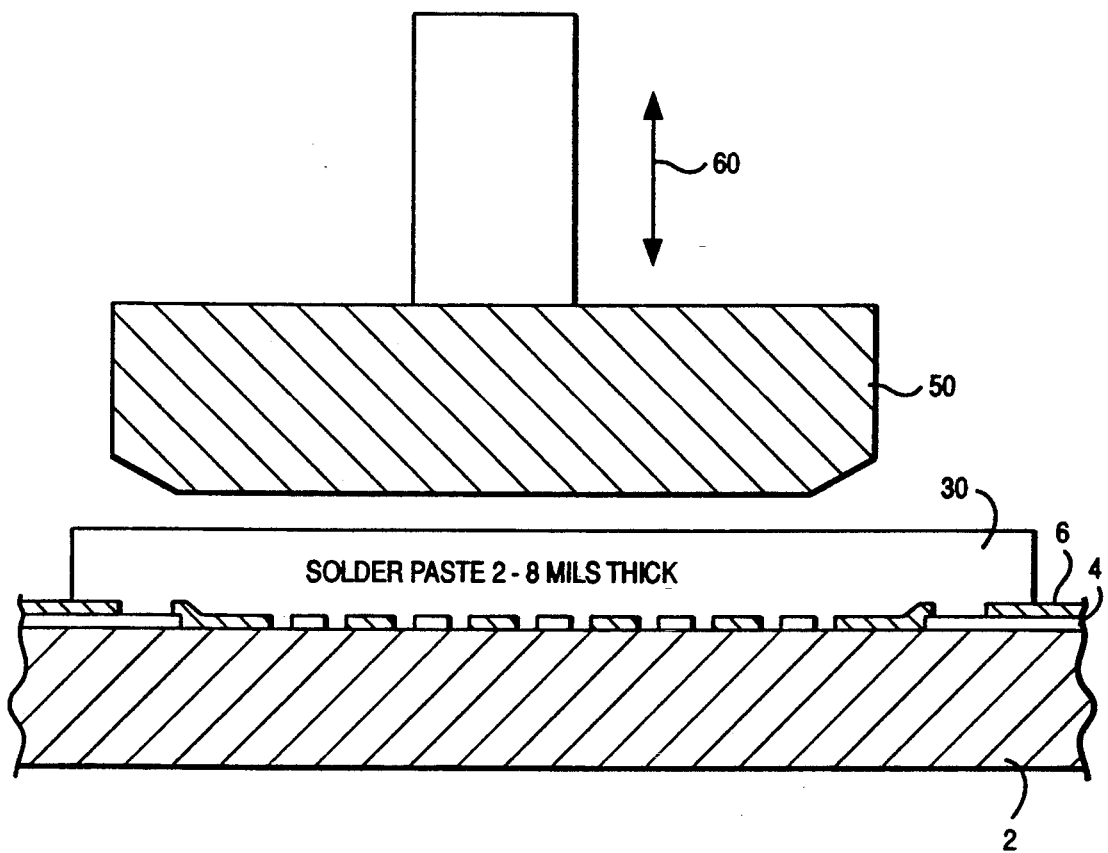
FIG. 3 shows a heated platen for reflowing solder on the lands.

Referring now to FIG. 3 the assembly is shown after solder 30 has been applied and mask 20 has been removed. Platen 50 is made of a solder non-wettable material and is heated and moveable as indicated by arrow 60, so as to apply heat and pressure to solder 30. Thus, having reference to FIGS. 1 and 3, in operation the inventive technique comprises the following steps:

a substrate having a solder resist coating provided thereon so as to be level with the height of the copper lands;

has solder paste stenciled through an appropriately dimensioned aperture in a mask followed by the application of heat and pressure, by a solder non-wettable platen, sufficient to reflow the solder.

The opening 22 in mask 20 would be approximately so many mils.

The heated platen 50 is then lowered into contact with solder 50 and remains for a time sufficient to melt solder 30. The required time is a function of solder composition. It has been found that for a eutectic composition of solder 0.5 sec is adequate. The solder non-wettable platen is then raised and conventional cleaning techniques are used for removing flux residue or any solder balls.

Those having skill in the art will appreciate that platen, solder non-wettable blade, design may be made to correspond to any opening configuration. For example, opening 22 in mask 20 may correspond to an entire footprint or to more than one footprint; and the solder non-wettable platen 50 may be serrated or grooved in areas that correspond to spaces between lands. Further, it may have plural limbs.

We have found that using a solder mask that is 0.0025 inches thick around pads having a diameter of 0.0072 inches and 63/37 tin lead solder cream, an average solder height of 2.6 mils was obtainable. If desired, a heated solder non-wettable platen 50 may also be used in a subsequent step to assure plurality of solder on lands 4.

Figure 4:
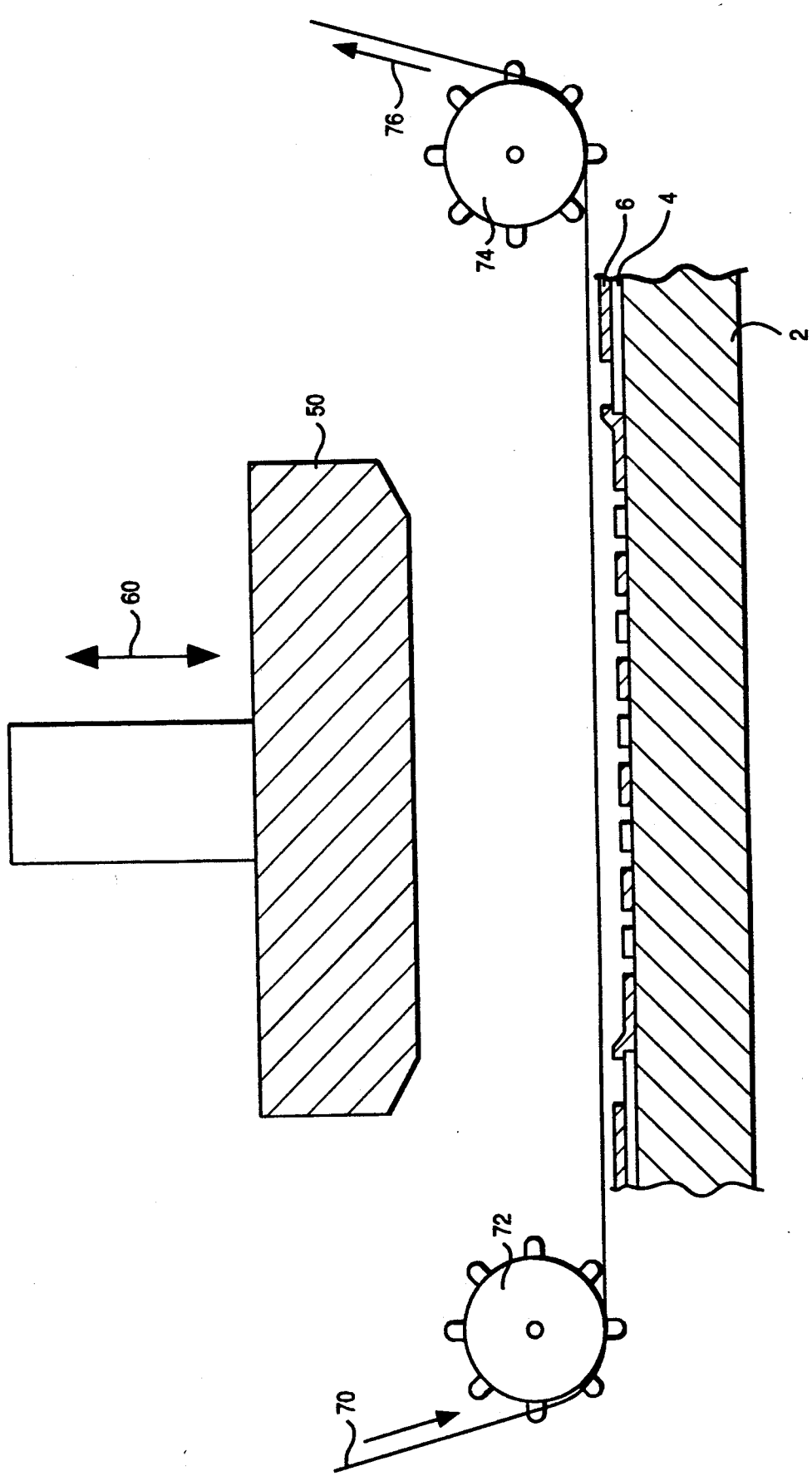
FIGS. 4 illustrate our solder foil application method.

Refer to FIG. 4 for an understanding of a second embodiment of our invention wherein the solder is in the form of foil. In FIG. 4 solder foil 70 is provided with marginal perforations so that pin wheels 72 and 74 may be utilized for positioning fresh foil at each land site. Pin wheels 72 and 74 are shown for illustrative purposes only and those skilled in the art will understand that other mechanisms may be used for positioning or advancing solder foil to land sites.

Once a length of foil 70 is accurately positioned over a plurality of lands 4, the operation of the inventive technique is similar to that described above. Heated platen 50 is lowered so as to place solder foil 70 in contact with lands 4 for a time sufficient to melt the solder. Solder non-wettable platen 50 is then raised, and cleaning using conventional techniques takes place as already noted.

Figure 5:
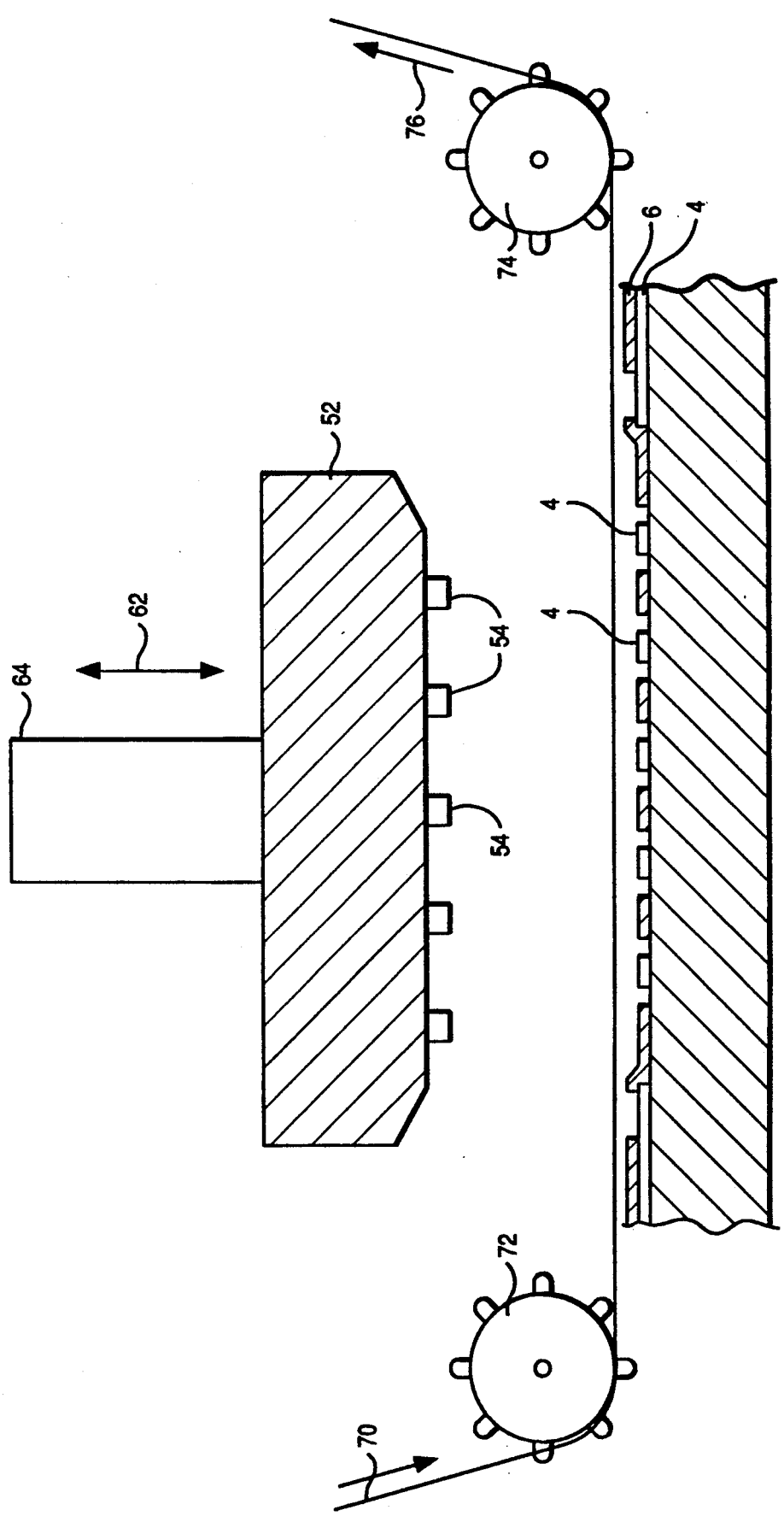
FIG. 5 shows another apparatus for applying solder foil at footprint sites.

Still another embodiment of our invention is shown in FIG. 5. In this instance platen 52 includes individual platens in the form of pins 54 arranged to correspond to exposed lands 4. In operation, solder non-wettable platen assembly 52 including individual platen pins 54 is lowered in the direction of arrow 62 with sufficient force to pierce solder foil 70. Since pins 54 are hot, the action of the assembly as it is lowered punches foil 70 onto exposed lands 4.

While our preferred embodiment uses individual platen pins 54 to punch solder from solder foil 70, we have also found that individual platen pins may be used in the embodiment of FIG. 3 with solder paste.

Having thus described our invention, it should be apparent those having skill in the art that it is readily adaptable to automated manufacturing techniques. Suitable materials for non-wettable platen 50 of FIGS. 3 and 4 include titanium and stainless steel. The individual platens of FIG. 5 may be made preferably of anodized aluminum. In any of the preferred embodiments, a solder non-wettable platen having an active surface in the same pattern as the land footprint may be combined into a single unit or multiplexed into a press-like apparatus. In that manner, plural footprints may have solder applied thereto simultaneously. In no case is precise alignment with respect to the platen and the footprint critical to our solder application technique which may be used for initial assembly or rework.

Further, in the embodiment shown in FIG. 5 a spring may be included in arm 64 to allow for compliant self-centering during operation of the solder non-wettable platen assembly for reflowing solder foil 70.

While the invention has been described having reference to a particular preferred embodiment and modifications thereto, various changes in form and detail may be made without departing from the spirit and scope of the invention as claimed.

We claim:

1. A method of applying solder onto fine pitch conductive lands on circuit substrates comprising the steps of:
   screening solder through a stencil having at least one aperture corresponding to a plurality of lands; and
   contacting the solder with a heated solder non-wettable platen corresponding substantially in size and shape to said at least one aperture for reflowing said solder.

2. A method of applying solder to a plurality of closely spaced conductive lands on a printed circuit board comprising the steps of:
   aligning solder foil over said lands; and applying heat and pressure to said foil sufficient to melt said foil, with a heated solder platen of a non-wettable material having a plurality of individual elements corresponding in relative position to said lands whereby solder adheres to said closely spaced conductive lands.

3. The method of claim 2 where said solder platen comprises
   a plurality of individual pin platens corresponding in number and relative position to said lands.

4. An apparatus for applying solder to a plurality of fine pitch lands on a circuitized substrate comprising:
   indexing means for positioning a strip of solder foil over said plurality of lands;
   a heated platen of a non-wettable material having a least one active surface area configured to correspond to an area occupied by said plurality, the platen having a plurality of individual elements corresponding in number and relative position to said plurality of lands; and
   means for effecting relative, reciprocal motion between said platen and said circuitized substrate whereby heat and pressure from said platen melt said solder foil.

5. The apparatus of claim 4 wherein said heated platen comprises a plurality of heated pins arranged to correspond in number and relative position to said plurality of lands.

6. The apparatus of claim 5 wherein said plurality of heated pins are vertically reciprocal for punching through said solder foil.

7. An apparatus for applying solder to closely spaced conclusive lands on a substrate comprising:
   a mask having at least an aperture corresponding in size to an area occupied on said substrate by a set of said lands;
   means for positioning said mask so as to have said at least one aperture over said set of lands;
   means for screening solder through said mask; and
   means for applying heat and pressure to said solder sufficient to melt said solder.

8. The apparatus of claim 7 wherein said means for applying comprises:
   a correspondingly configured platen of solder non-wettable material.

* * * * *